United States Patent [19]

Dubuisson et al.

[11] Patent Number: 4,641,425
[45] Date of Patent: Feb. 10, 1987

[54] METHOD OF MAKING ALUMINA INTERCONNECTION SUBSTRATE FOR AN ELECTRONIC COMPONENT

[75] Inventors: Jacques Dubuisson, Paris; Pascal Le Gal, Magny Le Hongre; René Boutterin, Montlhery, all of France

[73] Assignee: Interconnexions Ceramiques SA, Courbevoie, France

[21] Appl. No.: 765,087

[22] Filed: Aug. 13, 1985

Related U.S. Application Data

[62] Division of Ser. No. 679,724, Dec. 10, 1984.

[30] Foreign Application Priority Data

Dec. 8, 1983 [FR] France ............................. 83 19689

[51] Int. Cl.⁴ .............................................. H05K 3/36
[52] U.S. Cl. ........................................ 29/830; 29/851; 174/68.5; 264/61
[58] Field of Search ................. 29/851, 830; 174/68.5; 264/61

[56] References Cited

U.S. PATENT DOCUMENTS

| | | | |
|---|---|---|---|
| 3,079,282 | 2/1963 | Haller et al. | 117/212 |
| 3,095,340 | 6/1963 | Triller | 156/8 |
| 3,518,756 | 7/1970 | Bennett et al. | 174/68.5 X |
| 3,681,135 | 8/1972 | Cheary | 117/212 |
| 3,723,176 | 3/1973 | Theobald et al. | 174/68.5 X |
| 3,770,529 | 11/1973 | Anderson | 174/68.5 X |
| 3,852,877 | 12/1974 | Ahn et al. | 29/830 |
| 3,999,004 | 12/1976 | Chirino et al. | 174/68.5 |
| 4,024,629 | 5/1977 | Lemoine et al. | 174/68.5 X |
| 4,109,377 | 8/1978 | Blazick et al. | 174/68.5 X |
| 4,135,038 | 1/1979 | Tahoni et al. | 428/427 |
| 4,417,392 | 11/1983 | Ibrahim et al. | 29/830 X |
| 4,465,727 | 8/1984 | Fujita | 428/138 |
| 4,510,000 | 4/1985 | Kumar et al. | 29/851 X |

Primary Examiner—Howard N. Goldberg
Assistant Examiner—Carl J. Arbes
Attorney, Agent, or Firm—Pollock, Vande Sande & Priddy

[57] ABSTRACT

The substrate is formed by a stack of sheets of dielectric material (10) at least some of which have conductive patterns thereon (21-24); the substrate has conductive emerging portions (31, 32) for connecting the terminals of the component (1) to at least one internal layer provided with conductive tracks (24) providing layer-to-layer interconnection and interconnection with emerging portions in accordance with a pre-established patterns. According to the invention, the composition of the dielectric material comprises 92% to 98% alumina, and preferably 96%, with a melting agent based on magnesia titanate enabling the maximum firing temperature to be reduced to about 1400° C. The conductive patterns are made of a non-oxidizable metal which is not meltable at high temperature, e.g. palladium or a silver-palladium alloy. The properties of the substrate obtained in this manner are comparable to those of a substrate made of 99.9% ultra-pure alumina. The invention is also applicable to multi-level chip carriers made of this material.

8 Claims, 6 Drawing Figures

U.S. Patent  Feb. 10, 1987  4,641,425
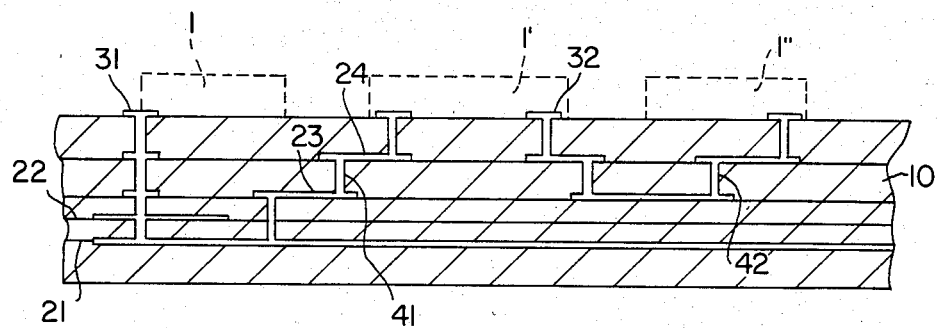
FIG. 1
FIG. 2
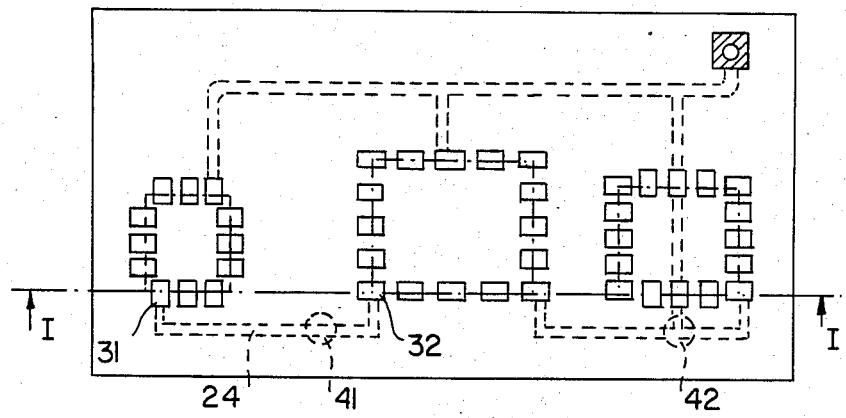
FIG. 3
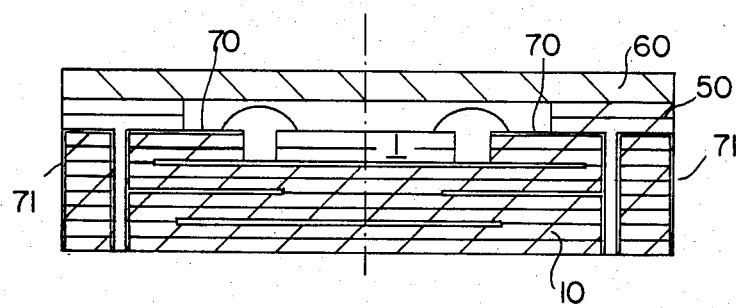
FIG. 4   FIG. 5   FIG. 6

METHOD OF MAKING ALUMINA INTERCONNECTION SUBSTRATE FOR AN ELECTRONIC COMPONENT

This is a division of application Ser. No. 679,724, filed 12/10/84.

The present invention relates generally to a substrate for electronic components; it may be required to support a single component (e.g. an integrated circuit chip), or else it may be required to support a set of discrete components which may be active or passive and all connected on the same substrate (a circuit card or a hybrid circuit).

BACKGROUND OF THE INVENTION

The substrate of the present invention is of the type formed by a sintered stack of sheets of dielectric material, at least some of which have conductive patterns, and having conductive portions (tracks or mere rims) emerging at its surface for subsequent connection to the terminals of the component. At least one internal layer of the substrate is also provided with conductive tracks for providing interconnections between layers (between internal layers or between an internal layer and an upper layer) and with emerging portions following a pre-established pattern.

Alumina is known to have advantageous properties in constituting substrates for electronic components when compared with conventional ceramics: excellent dielectric properties (in particular a small increase in the tangent of the loss angle as a function of frequency); high thermal conductivity (thus avoiding the appearance of hot points and facilitating heat sinking for power components or for very highly integrated components); good mechanical properties; and a good surface state enabling very fine conductors to be applied directly thereto, e.g. by photochemical etching.

The excellent high frequency behavior makes it possible to use such substrates at microwave frequencies or with very high speed logic circuits (having a switching period of about 100 ps) in which conventional ceramics cannot be used.

However, these various advantageous properties are only fully obtained for "ultra-pure" type alumina compositions, i.e. containing at least 99% $Al_2O_3$ and preferably at least 99.9% $Al_2O_3$. Such composition requires high temperature firing, at about 1600° C. to 1800° C., and the purer the alumina, the higher the temperature required.

The compositions currently used for making alumina substrates generally comprise 80% to 96% $Al_2O_3$. The resulting products have about 80% of the mechanical properties and 60% to 70% of the thermal properties of ultra-pure alumina. In contrast, the tangent of the loss angle increases or varies abnormally as a function of frequency, which prevents such alumina being used in microwave applications. Further, the firing temperature remains about 1600° C.

For example, U.S. Pat. No. 4,340,635 describes a composite structure substrate formed on a base of 96.6% alumina covered with a surface layer of 99.4% alumina (the invention of this patent is concerned with obtaining an ultra-pure alumina surface state on alumina which is only 96.6% pure). The firing temperature is 1575° C. to 1675° C. and is preferably 1640° C.

When it is desired to provide an interconnection substrate (i.e. a substrate which includes ab initio buried metallization rather than metallization added to the alumina after firing), this range of temperatures requires the use of refractory metals for making the buried interconnection tracks, e.g. molybdenum or tungsten, or an alloy of these metals (currently used non-oxidizable metals and alloys or have melting temperatures in the range 960° C. (silver) to 1550° C. (palladium), which are lower than the temperatures required for firing, which are about 1600° C.).

A first drawback of this technique results from the oxidizable character of these metals: the substrate must thus be fired under a reducing atmosphere in a controlled atmosphere oven (e.g. under a hydrogen atmosphere). Further, a substrate obtained in this way cannot withstand subsequent firing under an oxidizing atmosphere (e.g. ambient air), e.g. when adding additional surface conducting tracks at a later stage.

A second drawback comes from the formation during cosintering of a mixed diffusion oxide at the metal-alumina interface. Although this feature improves the bonding of conductive tracks on the surface of the substrate, it also has the drawback of forming buried conductors having poor geometry because of the diffusion zones. It is thus not possible to make very fine buried tracks for high density interconnections, nor to eliminate the risk of breaks occurring during cosintering (or short circuits occurring between conductors which are too close together).

A second technique for making interconnection substrates is also known, in which the firing takes place under an oxidizing atmosphere (e.g. ambient air) and at lower temperature, of about 900° C. to 1270° C. To do this, the composition is modified by adding silica to the alumina together with oxides of alkali metals or alkali-earth metals (magnesia, lime, soda, potash) so as to come closer to a porcelain or to a ceramic glass.

It then becomes possible to use non-oxidizable and nonmeltable metals at the maximum temperatures obtained during firing, e.g. palladium, gold, silver or alloys of these metals. European patent specification No. 0 045 877 describes an example of a substrate of this type.

However, the properties of the resulting substrates are not comparable to the properties of substrates made of pure or ultra-pure alumina. The mobility of the alkali additives increases the electrical conductivity of the dielectric, which also becomes temperature sensitive. A high concentration of silica loses the exceptional thermal and mechanical qualities of alumina and comes closer to those of glass (poor thermal conductivity, fragility). In any event, microwave applications are still not possible.

A third technique derived from the second consists in a first step of firing a base of pure or ultra-pure alumina followed by silk screening conductors on its surface, and then covering the conductors with a layer of ceramic glass, and finally firing the assembly at low temperature (850° C. to 900° C.). The steps of silk screening, covering, and firing are then repeated as many times as required to obtain a plurality of buried interconnection levels.

However, the possibilities of this technique are limited to a small number of interconnection levels by virtue of the cummulative diffusion of metal during successive applications of firing. Further, since the intermediate layers are not made of alumina, the electrical and thermal performance of the resulting assembly is limited.

The invention aims at eliminating these drawbacks and at escaping from the compromise solutions of the prior art, by proposing an interconnection substrate of alumina having high performance in spite of being made by means of simplified technology. The invention also aims at providing a method of manufacturing such a substrate.

More precisely, one of the objects of the invention is to obtain an interconnection substrate which combines the properties which, up to now, have been exclusive to ultra-pure alumina, namely: the excellent dielectric properties required for microwave applications; high thermal conductivity enabling effective heat sinking for dissipating high levels of heat generation on a small surface area; directly obtaining a good surface state; low porosity; mechanical robustness; the possibility of providing very thin dielectric layers; the possibility of providing many such layers and at various thicknesses; and uniform shrinkage during firing.

Another aim of the invention is to make it possible to provide interconnection substrates under an oxidizing atmosphere with a maximum firing temperature which is reduced to a value of about 1400° C., which makes it possible, in particular, to employ metals such as palladium and its alloys since they diffuse little or not at all in alumina instead of using oxidizable refractory metals such as molybdenum or tungsten which have been the only metals suitable up to the present.

Another aim of the invention is to provide such a substrate in a single firing operation acting on all the layers of the product, thereby eliminating the defects associated with the methods of applying successive firings.

Another aim of the invention is to provide an interconnection substrate having metallized holes for interconnecting one layer to another, a layer to the surface, and one face of the substrate to the other (hereinafter designated "vias") having excellent cylindrical geometrical characteristics, and ensuring a low reject rate after compression and also after sintering, and in which the metallization of the vias, as well as of the rims formed at the outlets of the vias, bonds particularly well to the substrate.

Because of the absence of diffusion, the use of metals such as palladium and its alloys improves the geometrical quality of the conductors. However, it also has a corresponding drawback of the metal bonding poorly to alumina, unlike tungsten or molybdenum, for example, which form intermediate compounds in the diffusion zone at the metal-alumina interface (see, for example, Otsuka et al "Interfacial bond strengh in alumina ceramics metallized and cofired with tungsten" in Ceramic Bulletin Vol 60, No. 5, 1981). It will be seen that in one of its aspects, the invention provides a way of escaping from this dilemma.

SUMMARY OF THE INVENTION

The present invention provides an interconnection substrate for electronic components, the substrate being formed by a sintered stack of sheets of dielectric material, at least some of which include conductive patterns, said substrate having conductive emerging portions for providing links to the terminals of the component(s), with at least one internal layer being provided with conductive tracks ensuring interconnection between layers and having its emerging portions disposed according to a pre-established pattern. According to the invention the composition of the dielectric material comprises 92% to 98% $Al_2O_3$ and a dielectric melting agent based on magnesia titanate having a composition lying in the range ($TiO_2$, 0.5 MgO) and ($TiO_2$, 6 MgO) in such a manner as to reduce the maximum sintering temperature to a value lying in the range 1350° C. to 1450° C., and the conductive patterns are made of a non-oxidizable metal which does not melt at high temperature, or of an alloy of such metals.

(The term "high temperature" is used to designate the maximum temperature required to sinter the component in question).

The reduction in the maximum sintering temperature to values in the range 1350° C. to 1430° C. (and generally 1400° C. to 1410° C.) results from the addition of magnesia titanate to ultra-pure $Al_2O_3$ (99.9%) pure. Magnesia titanate is an agent which is already known, per se, for its advantageous dielectric properties, in particular at microwave frequencies.

The invention is based on the observation of the melt-enhancing properties of the agent in this compound when combined with alumina. Further, and above all, this combination integrally conserves the dielectric, thermal, mechanical, . . . , properties of ultra-pure alumina as will be observed from the properties described in an illustrative example of the composition given below.

Preferably, the proportion of $Al_2O_3$ lies in the range 95% to 97%.

Also preferably, the composition of the melting agent is ($TiO_2$, MgO).

It should be observed, both here and in what follows, that all the proportions of the various constituents are given by weight and for anhydrous constituents.

It is essential to observe that a certain number of precautions must be taken throughout the manufacturing method, both concerning choice of materials and the conduct of the method.

The following requirements are considered as necessary for obtaining all the characteristics in the final product which up until the present were considered as being exclusively the property of ultra-pure alumina:

the granulometry of the composition when in the form of raw material should be in the range 0.2 $\mu$m to 0.4 $\mu$m; and there should be no halogenated or alkali compounds and no carbonated residues in any of the agents used either as raw materials or as evanescent materials (i.e. materials which are necessary for preparing and shaping the dielectric sheets but which disappear during sintering).

Such compounds are often present in the products constituting conventional aluminas (e.g. clays) or are added as defloculating agents (for preparing the slip) or as organic binders or as melting agents. They should be avoided when preparing a substrate in accordance with the invention.

Although it is easier to eliminate them than a binder, it appears desirable also to exclude halogenated solvents (e.g. trichloroethylene).

During sintering, very accurate temperature control is required. It is desirable for the temperature to be uniform to within ±1° C. over the entire surface of the plate.

The conductive patterns are advantageously made of palladium or of a silver-palladium alloy.

The melting point of pure palladium is 1552° C., which is fully compatible with firing the alumina to a temperature of about 1400° C.

If a silver-palladium alloy is used, the proportions of the two metals are so chosen that the melting temperature of the alloy remains below the maximum temperature reached during firing, e.g. an alloy having at least 60% palladium for a firing temperature of 1400° C. (these values are determined from the binary Ag-Pd alloy chart). This makes it possible to take advantage of the highly conductive properties of silver-palladium alloys.

The fact that palladium passes through an oxidizable state between 384° C. and 920° C. is not a difficulty in implementing the invention since, as the temperature drops after firing, the buried metallization is sealed by the sintered dielectric so that the palladium remains in metallic form and any subsequent oxidation is prevented, even during subsequent firing. As for the emerging portions, a protective oxide film is formed on the solid metal but does not impede subsequent soldering or brazing operations.

Advantageously, the layer-to-layer interconnections and the emerging portions are made by means of vias whose metallized coating is based on a metal which is neither oxidizable nor meltable at high temperature or from an alloy of such metals.

In a manner characteristic of the invention, the vias are coated by a metallization ink which is impregnated with $Al_2O_3$, the conductive patterns then being made from an ink which is not impregnated with $Al_2O_3$. Preferably, the composition of the ink impregnated with $Al_2O_3$ comprises an evanescent organic vehicle with 60% to 80% of free metal and 2% to 5% of $Al_2O_3$.

Advantageously, the composition of the ink impregnated with $Al_2O_3$ includes a melting agent based on silica and on magnesia and suitable for reducing the firing temperature of the ink to a value equal to or slightly lower than the firing temperature of the alumina of the substrate. Preferably, the relative proportions of the melting agent and the $Al_2O_3$ are about ($Al_2O_3$, $4SiO_2$, $3MgO$).

As has been mentioned above, palladium (or a silver-palladium alloy) is a metal which does not diffuse in the ceramic. On the contrary, during sintering it shrinks and the higher the concentration of palladium in the ink, the more it shrinks (the ink used for making buried interconnection tracks generally contains 40% to 60% palladium, with the rest being constituted by evanescent organic binders and solvents).

The addition of $Al_2O_3$ to the ink used for metallizing the vias (which is thus not the same as the ink used for the buried conductors) makes it possible to create a ceramic "skeleton" on the inside of the hole during sintering, which skeleton hinders shrinkage of the palladium (which shrinks more than does the ceramic) and makes it possible to obtain an excellent geometry for the via, which retains its cylindrical shape rather than taking up a "barrel" shape.

Further, the formation of a transition zone is observed which ensures a high degree of bonding between the metal and the substrate.

Finally, phenomena associated with creep during compression (holes which close up) and to the formation of splits during sintering are avoided.

The proportion of correctly formed vias is close to 100%, as compared with about 10% when using an ink which is identical to that used for the buried conductors, i.e. an ink which has an alumina impregnated therein.

In contrast, the buried conductors and the conductors on the surface of the substrate are made from an ink with no $Al_2O_3$ impregnated therein, which ensures that they retain good geometry since the palladium does not diffuse.

Advantageously, the rims or openings of the vias are made with the same $Al_2O_3$-impregnated ink. These rims serve to retain conductors at the surface of the substrate which bond poorly thereto.

The invention thus concerns an interconnection substrate made in the same manner as multilayer printed circuits, i.e. with a plane upper surface that may bear superficial conductive tracks.

On one or other (or both) faces of the substrate, metal tabs may appear corresponding to component terminals (i.e. for capacitors, integrated inductors) which may be isolated or interconnected, or corresponding to the terminals of a buried interconnection network, or a ground plane, .... The addition of discrete components connected to these tabs will provide a hybrid circuit, in a manner which is conventional per se.

However, it is also possible for the substrate to form an omnibus base which a user can use and personalize as a function of his own requirements by adding surface interconnections (silk screening conductors or resistances). This is comparable to the technique of using prediffused circuits in active components.

This particularly advantageous characteristic makes it possible, with a substrate in accordance with the invention, to proceed with subsequent firing under an oxidizing atmosphere which is an operation typical of silk screening. Conventionally, inks based on ruthenium or palladium are used which require firing to about 750° C. to 950° C.

The invention also relates to substrates known in the art as "chip carriers", i.e. whose upper surface is stepped over at least two levels. Generally speaking, these substrates have three levels. A lower level, in the middle, serves to support the chip which is generally a large scale integrated circuit; a peripheral intermediate level (having several times the periphery of the lower level itself) is provided with emerging portions for connection to terminals of the chip, while the upper level constitutes a peripheral spacer for sealing to a cover which completely encloses the component and also hides the upper, stepped, surface of the substrate.

Connections to the outside are then made via portions emerging sideways from the substrate, or via metallized holes leading to the surface of the top stage.

In all cases, in addition to in situ interconnections, the excellent dielectric properties of the substrate make it possible to provide internal conductive patterns which operate as a ground plane, as plates for decoupling or filtering capacitors, as power supply lines, or as integrated inductors, or as heat sinks. Thus only resistive components need to be added at the surface.

The invention also concerns a method of manufacturing such substrates, the method providing steps of:

make holes through the raw sheets, by means of a high speed twist drill for sheets thicker than about 250 μm, or by punching thinner sheets:

filling the holes with a metallization ink based on palladium or silver-palladium and which is impregnated with $Al_2O_3$, or with an aluminous ceramic;

silk screening individual sheets of alumina with a deposit of a first metallization ink that is not impregnated with $Al_2O_3$;

stacking the individual sheets;

agglomerating the block under heat and under pressure; and co-sintering by firing at high temperature under an oxidizing atmosphere, and after slow, programmed removal of the organic binders.

Advantageously, during the hole-drilling step, the rims at the ends of the holes are also silk screened with a deposit of the second metallizing ink together with the surface conductors on the substrate with a deposit of the first metallizing ink.

Preferably, the holes are filled in this case by silk screening and sucking the sheets to a base and interposing a sheet of porous paper between the bottom sheet and the base supporting the machine. If necessary this operation may be performed from both sides of the substrate.

BRIEF DESCRIPTION OF THE DRAWING

Embodiments of the invention are described, by way of example, with reference to the accompanying drawing, in which:

FIG. 1 is a section through a plane substrate in accordance with the invention, on a line I—I of FIG. 2;

FIG. 2 is a plan view of the same substrate;

FIG. 3 is a section view similar to FIG. 1 through a chip carrier having a plurality of levels;

FIG. 4 is a perspective view of the FIG. 3 substrate on its own (without any chips and without its cover); and FIGS. 5 and 6 show variants of the FIG. 4 embodiment for cases where the external connections are made by means of metallized holes rather than by portions emerging sideways.

MORE DETAILED DESCRIPTION

FIG. 1 is a section through a substrate 10 (shown in plan in FIG. 2) for supporting an electronic component 1. Although the substrate has been shown for a single component, larger substrates could be used to support and interconnect a plurality of active and passive components placed on the surface thereof.

The substrate 10 is provided with conductive emerging portions such as 31 and 32 for connection to the terminals of the component. These emerging portions may simply be rims to which connection wires will be soldered, or they could also be constituted, as shown, by conductive tracks which extend over the surface of the substrate and which are connected either to external components, or to other components disposed on the same substrate.

The substrate 10 is constituted by a plurality of layers supporting different patterns of conductors and referenced 21 to 24 and mutually interconnected. By way of example, an electrode 21 is shown as constituting a ground plane, an electrode 22 is shown as constituting one plate of a capacitor which, together with the ground plane 21 constitutes a power supply decoupler, and links 23 and 24 serve to interconnect different terminals of a single component or to interconnect the terminals of several components disposed on the same substrate (the pattern of these interconnections is shown by way of example in dashed lines in FIG. 2).

The interconnections between the various layers and with the portions emerging on the surface of the substrate are preferably made by means of metallized holes such as 41 and 42 which pass through various layers to be interconnected (these holes are shown as passing right through the substrate, but they could also be in the form of blind holes).

Such a substrate is manufactured as follows:

initially the individual alumina sheets are glued to a frame, or else sets of several sheets (e.g. 4 to 6) which have already been compressed are glued thereto for forming the various layers of the substrate.

the holes for providing the interconnections are then made by drilling through the raw sheets. The drilling is preferably performed by means of a carbide twist drill rotating at high speed (more than 30,000 rpm) under the guidance of a pattern recognition machine driven by a computer;

the holes are filled with a specific metallization ink, thereby filling the vias for unit sheets of less than 250 μm thickness; the specific metallization ink is different from the ink used for silk screening the conductive patterns (whether internal or on the surface) and includes for example 60% to 80% palladium and 2% to 5% ultrafine $Al_2O_3$, together with melting agents, e.g. 3 parts MgO and 4 parts $SiO_2$ for each part of $Al_2O_3$.

the conductive patterns are then silk screened on each of the sheets in conventional manner using another ink which includes, for example, 40% to 60% palladium together with evanescent solvents and organic binders but not impregnated with $Al_2O_3$;

the various sheets prepared in this way are then superposed to form a stack.

Holes passing right through the substrate, of large diameter and through thick sheets are then metallized a second time, if necessary. To do this, a drop of metallization ink is placed thereon and allowed to run down the hole under gravity; the ink may also be deposited by means of a brush inserted in the hole. The ink used is an alumina-impregnated ink, of the same type as that originally used for metallizing the holes.

Advantageously, the sheets are held on a base by suction in conventional manner and a sheet of porous paper (such as filter paper) is interposed so that when the metallization ink is deposited, it is distributed uniformly inside the hole by virtue of the suction; the porous paper also makes it possible to recover excess ink which prevents dirtying the bottom face of the stack.

The stack is then hot agglomerated under pressure into a homogeneous block.

The organic binders and solvents are removed by vacuum treatment followed by a very slow programmed rise in temperature under an oxidizing atmosphere taking into account the intrisic characteristics of the organic materials. This operation may last for a week and is fundamental for obtaining a substrate with perfectly homogeneous characteristics.

The assembly is then fired. This firing takes place at high temperature (1400° C.) and under an oxidizing atmosphere; it may for example take place in a through-passage or a fixed oven for a total duration of ten hours for example.

When required, conductive tracks are applied to the surface by silk screening conductors based on silver or on a silver-palladium alloy or on gold using a melting agent so as to bind to the substrate (a conventional hybrid circuit technique). Resistors and capacitors can also be made by this technique.

Such an interconnection substrate has excellent dielectric and mechanical properties. For example, for a composition comprising 96% alumina and a dielectric melting agent based on magnesia titanate having the formula ($TiO_2$, $MgO$), the following characteristics are obtained:

dielectric characteristic relative to air: about 9.1;
dielectric strength: about 70 V/$\mu$m;
loss angle tangent less than $1.10^{-4}$ at 1 MHz;
insulation resistance greater than 1000 G$\Omega$ for a thickness of 50 $\mu$m and practically unvarying with temperatures, at least up to 200° C.;
uniform shrinkage to within about 0.1% for a 25% shrinkage of an area of 70 mm×70 mm. This value corresponds to an improvement of about one order of magnitude relative to other ceramics (uniformity to within about 1%);
excellent roughness directly obtained by the firing and comparable to 99.9% alumina. This characteristic enables fine lines to be obtained compatible with photolithographic etching;
average porosity less than 1 $\mu$m.

From the thermal point of view, it may be observed that the thermal conductivity of alumina is greatly improved by the presence of the conductive tracks which thus play the role of heat sinks.

The conductive patterns generally provide electrical resistance of about 0.01 $\Omega$ per square. This value may be reduced by increasing the thickness of the metal layer or by providing a plurality of conductors connected in parallel and distributed over a plurality of layers of the substrate.

Finally, it should be observed that thin dielectric layers may be obtained (25 $\mu$m as compared with a minimum of 50 $\mu$m for a conventional ceramic) and that the layers may be of different thicknesses. It is also possible to use a very large number of layers (15 to 20 without difficulty) thus providing a very large number of interconnection layers and thus a very high density of conductors per $cm_2$. The number of lays is thus practically unlimited, unlike prior art methods using multiple firings.

The invention is particularly applicable to providing chip supports for integrated circuits in the form of multi-level housings as shown in FIGS. 3 to 5. FIG. 3 shows a substrate having the same structure as shown in FIG. 1 (thus having interconnection links, and optional capacitive components, . . . ), and an intermediate stage on which connections 70 are fitted for connection to the terminals of the component, this substrate is also provided with lateral outputs 71 which are particularly visible in FIG. 4.

An additional stage is formed by a layer 50 which constitutes a spacer for sealing a cover 60 above the support assembly in order to insulate the component and its apparent connections.

FIG. 5 shows a variant in which the side outputs 71 shown in FIG. 4 have been replaced by metallized holes 72 opening out in the top surface thereof.

Another variant is shown in FIG. 6 where the outputs are constituted by pins which are mechanically and electrically fixed in the above-mentioned holes by soldering or brazing.

The outside shape of such packages is generally standardized, for example in accordance with the JEDEC recommendations.

The method of manufacturing these supports is the same as that described above for manufacturing plane supports except that the size of the assembly is smaller (a standard support is half an inch $\frac{1}{2}''$ (1.3 cm) in size whereas substrates may be as much as 3.5"×7" (about 9×18 cm)).

To make the various levels on the top surface, it is sufficient to add one or more sheets of raw alumina to the stack having a central window of the a corresponding to the lower layer that is to remain visible. The assembly is then stamped by a punch having a profile complementary to that desired.

In the same manner as for a plane substrate it is possible to provide capacitive components, for decoupling and for filtering, a ground plane, integrated inductances, . . . in addition to their interconnections.

We claim:

1. A method of manufacturing an interconnection substrate for electronic components formed by sintering a stack of sheets of dielectric material, at least some of said sheets having conductive patterns thereon, said substrate having conductive emerging portions for connecting the terminals of said component(s) with at least one internal sheet being provided with conductive tracks for providing interconnection between layers and with said emerging portions in accordance with a pre-established pattern, wherein the method comprises the steps of:

preparing a raw dielectric composition comprising 92% to 98% $Al_2O_3$ and a melting agent based on magnesia and titania having a composition corresponding to a ratio by weight of $TiO_2$ to $MgO$ in the range of 1:0.5 to 1:6;

forming said raw dielectric composition into individual sheets of material;

making holes through said individual sheets by means of a high speed twist drill, or by means of a punch;

filling the holes with a first metallization ink, said ink comprising an organic vehicle, a free metal from the group consisting of palladium and silver-palladium alloys, and $Al_2O_3$ in a concentration range of 2% to 5%;

silk screening the individual sheets with a deposit of a second metallization ink, said ink comprising an organic vehicle, a free metal from the group including palladium and silver-palladium alloys, the composition of said second metallization ink being substantially free of $Al_2O_3$;

stacking the individual sheets;

agglomerating the resulting block of sheets under heat and under pressure;

evacuating the organic vehicle from the inks; and sintering the agglomerated sheets together by high temperature firing under an oxidizing atmosphere.

2. The method of claim 1, wherein the composition of the first metallization ink further includes a melting agent comprising $MgO$ and $SiO_2$ for reducing the firing temperature of said first metallization ink to a value not greater than the firing temperature of said dielectric composition.

3. The method of claim 2, wherein the $SiO_2$ to $Al_2O_3$ and $MgO$ to $Al_2O_3$ ratios are about 4:1 and 3:1, respectively.

4. The method of claim 1, wherein the composition of the first metallization ink includes 60% to 80% of said free metal.

5. The method of claim 1, wherein the composition of the second metallization ink includes 40% to 60% of palladium.

6. A method according to claim 1, wherein rims are also silk screened at the ends of the holes with a deposit of said first metallization ink on at least one of the top and bottom sheets of the stack.

7. A method according to claim 1, wherein the sheets are held on a base by a vacuum and holes are filled by applying a vacuum to the sheets through a layer of porous paper interposed between the bottom sheet and the base.

8. A method according to claim 1, wherein a hybrid circuit is subsequently added to at least one of the two faces of the substrate made together with its internal interconnections and its internal discrete components, said hybrid circuit being connected to the assembly constituted by the circuitry and the internal discrete components by means of tabs appearing on the substrate.

* * * * *